United States Patent
Hirt

(10) Patent No.: US 6,686,760 B2
(45) Date of Patent: *Feb. 3, 2004

(54) PHOTOSENSORS FOR TESTING AN INTEGRATED CIRCUIT

(75) Inventor: Ernie R. Hirt, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/283,932

(22) Filed: Oct. 29, 2002

(65) Prior Publication Data

US 2003/0169063 A1 Sep. 11, 2003

Related U.S. Application Data

(62) Division of application No. 10/125,027, filed on Apr. 18, 2002, now Pat. No. 6,590,410, which is a continuation of application No. 09/218,261, filed on Dec. 21, 1998, now Pat. No. 6,448,802.

(51) Int. Cl.$^7$ .............................................. G01R 31/28
(52) U.S. Cl. ..................................... 324/765; 324/158.1
(58) Field of Search ........................ 324/765, 751–753, 324/158.1, 754; 250/338.4, 370.01, 559.05, 559.07

(56) References Cited

U.S. PATENT DOCUMENTS

| | | | |
|---|---|---|---|
| 3,956,698 A | 5/1976 | Malmberg et al. | |
| 4,053,833 A | 10/1977 | Malmberg et al. | |
| 4,703,260 A | 10/1987 | Beha et al. | |
| 4,843,329 A | 6/1989 | Beha et al. | |
| 4,965,515 A | 10/1990 | Karasawa | |
| 4,967,152 A | 10/1990 | Patterson | |
| 5,030,909 A | 7/1991 | Blancha et al. | |
| 5,216,359 A | 6/1993 | Makki et al. | |
| 5,327,075 A | 7/1994 | Hashinaga et al. | |
| 5,541,547 A | 7/1996 | Lam | |
| 5,548,211 A | 8/1996 | Tujide et al. | |
| 5,994,915 A | 11/1999 | Farnworth et al. | |
| 6,448,802 B1 * | 9/2002 | Hirt ........................... | 324/765 |

* cited by examiner

Primary Examiner—Kamand Cuneo
Assistant Examiner—Jimmy Nguyen
(74) Attorney, Agent, or Firm—Blakely, Sokoloff, Taylor & Zafman LLP

(57) ABSTRACT

An apparatus and method of testing an integrated circuit includes providing a first spectral input to the integrated circuit. A photosensor converts the first spectral input to a gating signal input that is used to gate a result output. The result output is checked to determine whether the integrated circuit is functioning properly. For one embodiment, the result output is used to provide a visual indication whether the integrated circuit is functioning properly. This allows for contactless testing of the integrated circuit, whether the circuit is in die form, wafer form, or packaged form.

26 Claims, 9 Drawing Sheets

PHOTOSENSORS FOR TESTING AN INTEGRATED CIRCUIT

RELATED APPLICATIONS

This application is a divisional of application Ser. No. 10/125,027, filed on Apr. 18, 2002, issued to U.S. Pat. No. 6,590,410 on Jul. 8. 2003, which is a continuation of application Ser. No. 09/218,261, filed on Dec. 21, 1998, issued to U.S. Pat. No. 6,448,802, on Sep. 10, 2002.

BACKGROUND OF THE INVENTION

1. Field of the Invention

The described invention relates to testing of an integrated circuit. In particular, the invention relates to the testing of circuitry by providing an input via photosensors on the integrated circuit.

2. Description of Related Art

Integrated circuits are tested at the wafer level by supplying inputs via contacts. Input signals are provided to the integrated circuit by making physical contact with traces or bond pads on the integrated circuit. Testing is often done prior to the integrated circuit die being packaged to ensure that only functional die proceed to the packaging stage. As the need for testing increases, more bond pads are typically added so that more signals on the integrated circuit die may be probed. Often only one die can be tested at a time due to physical limitations of the machinery required to make physical contact with each integrated circuit die.

Contact testing of the integrated circuit can be costly in terms of the time required to connect to the contacts. Additionally, problems may arise with contact testing regarding the integrity of the connection to the bond pads as well as the integrity of the electrical characteristics of the integrated circuit itelf, e.g., due to extra load on the circuit because of the contact connection.

SUMMARY OF THE INVENTION

An apparatus and method of testing an integrated circuit includes providing a first spectral input to the integrated circuit. A photosensor converts the first spectral input to a gating signal input that is used to gate a result output. The result output is checked to determine whether the integrated circuit is functioning properly. For one embodiment, the result output is used to provide a visual indication whether the integrated circuit is functioning properly.

DETAILED DESCRIPTION

Image sensor technology is used to provide the capability of contactless testing of integrated circuits (ICs). Contactless testing allows for faster and more reliable testing, as will be described.

Image sensors are used in cameras for capturing an image. Typically, an image is focused by optics onto an image sensor array. The image sensor array comprises individual photosensor cells (photosensors), each of which has a color filter that responds to a particular color input, as will be shown with respect to FIG. 4. The photosensors are situated in an array with color filters arranged in a mosaic pattern to allow replication of the image by sampling particular colors at various locations of the image sensor array and interpolating these colors to other locations of the image sensor array. This image sensor technology can be used for testing an IC.

Figure 1:
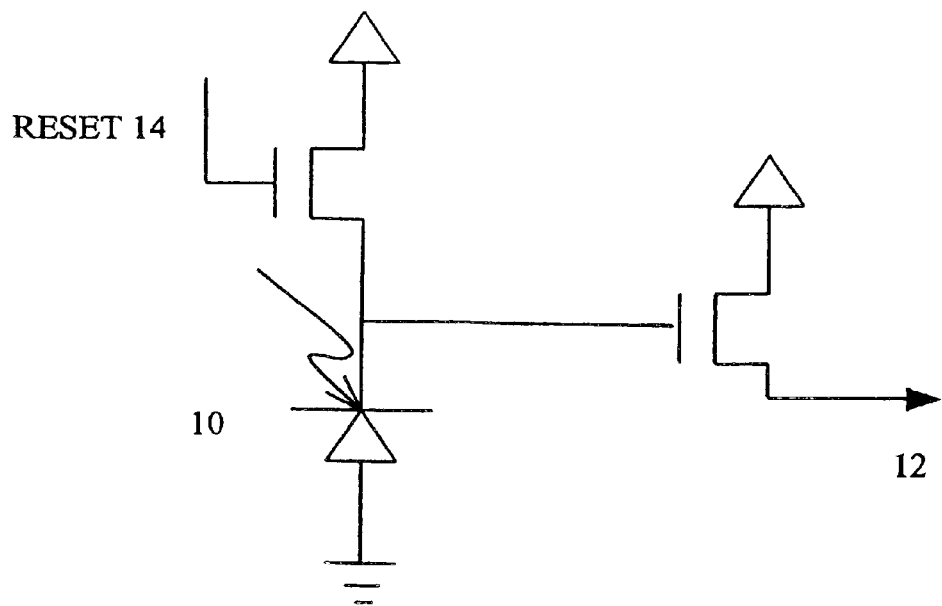
FIG. 1 shows a prior art example of a photosensor cell.

FIG. 1 shows a prior art example of a photosensor cell. The photosensor cell includes a photodiode 10 that discharges responsive to light hitting it. An output 12 of the photosensor cell indicates whether the photosensor cell is charged or not, and a reset signal 14 is used to clear the photosensor cell by shorting the photodiode to a reference voltage level. For one embodiment, the photosensor cell is made using complementary metal oxide semiconductor (CMOS) technology. However, other technologies are possible, including NMOS and PMOS. A charge-coupled device (CCD) may also be employed.

Figure 2:
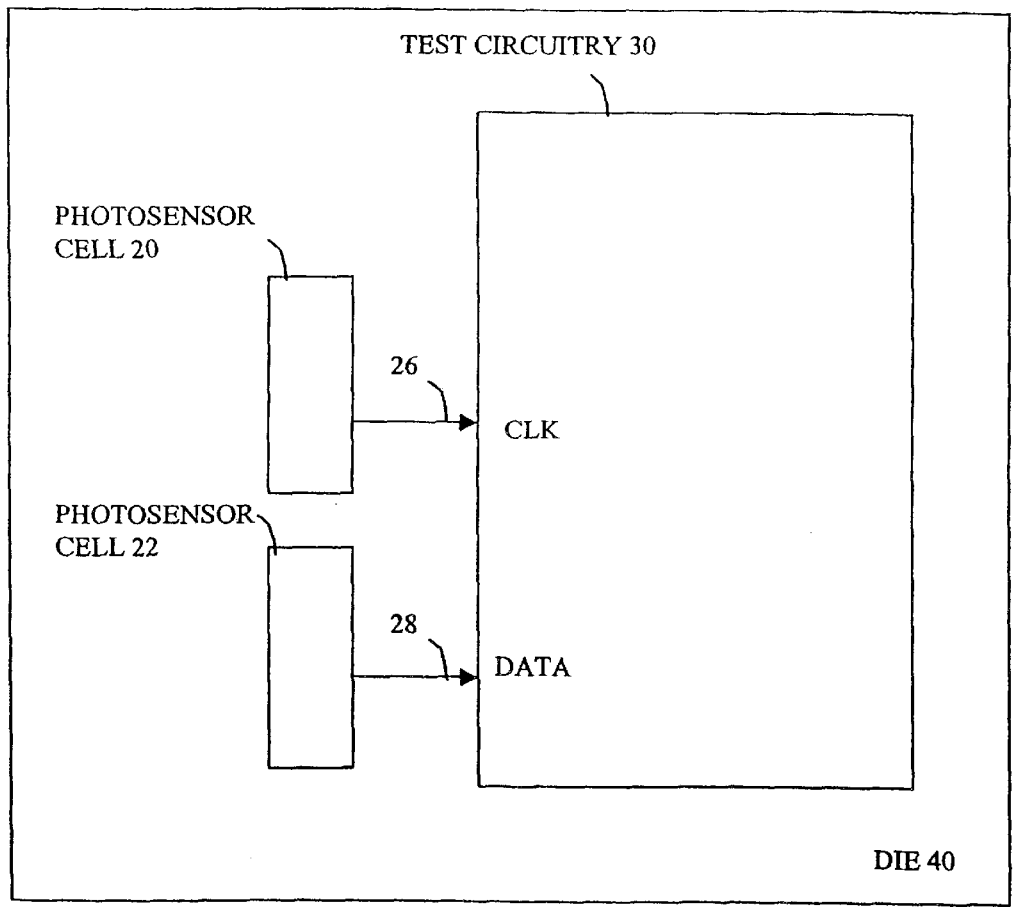
FIG. 2 shows one embodiment of photosensor cells providing an input to circuitry undergoing testing.

FIG. 2 shows one embodiment of photosensor cells providing an input to circuitry undergoing testing (test circuitry 30). For one embodiment, a first photosensor cell 20 is coupled to provide a gating input 26, such as a clock input to test circuitry 30, and a second photosensor cell 22 is coupled to provide a data input 28 to test circuitry 30.

For one embodiment, the gating input 26 is a clock input for boundary scan testing, as defined in IEEE Standard Test Access Port and Boundary Scan Architecture (1149.1 standard). The data input 28 provided by the second photosensor cell 22 provides the test data used in the boundary scan testing. The gating input 26 provides a clock signal to generate a result output of the boundary scan testing, as is well known.

Figure 3:
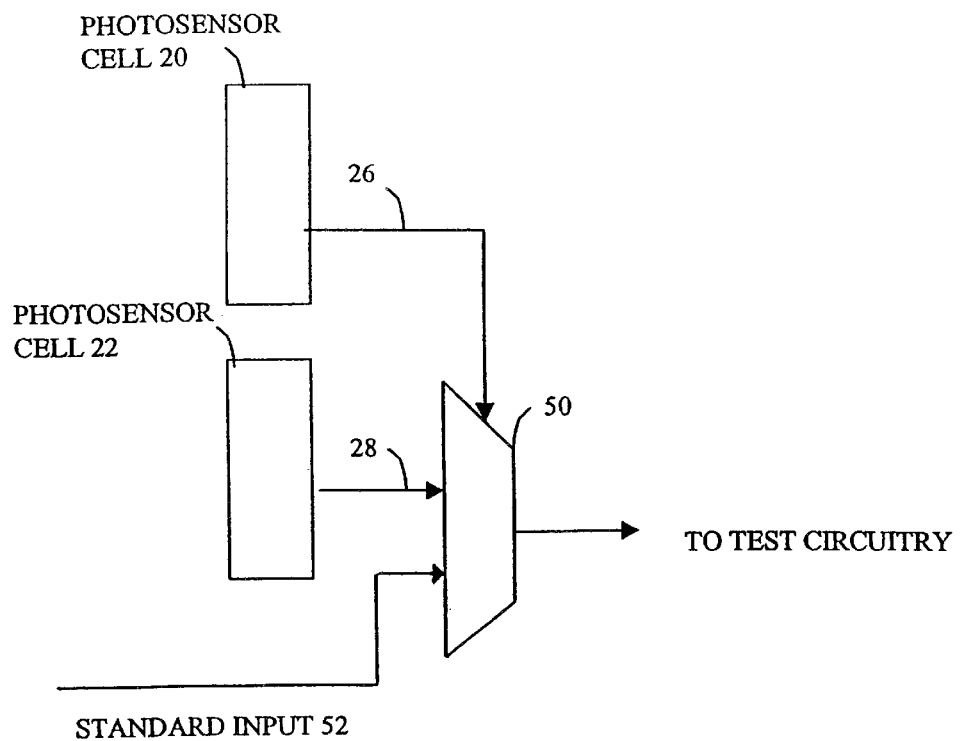
FIG. 3 shows an alternative embodiment for providing test inputs to an integrated circuit.

FIG. 3 shows an alternative embodiment for providing test inputs in which the gating input 26 is provided to enable a multiplexer 50 to select the data input 28 from photosensor cell 22 to bypass a standard input 52 of the test circuitry. Thus, the data input 28 allows a known input to be provided to the test circuitry. This embodiment allows each circuit under test to be tested independently: each circuit is decoupled from signals arising in other sections of the die in order to provide predictable test results. One example of using this type of testing is in power-up testing of a die, such as in Built in Self Testing (BIST).

In another embodiment, clocking circuitry on the integrated circuit die starts automatically upon power being provided to the die. Data inputs provided by one or more photosensor cells provide the test signals needed for testing the integrated circuit using the clocking circuitry of the integrated circuit. In this case, a gating signal is not needed.

Testing of the circuitry provides a result output indicative of whether the test passed or failed. The result output may be a single bit or it may be a series of bits that indicate various pass/fail results. The result output may be stored in a result register or other buffer. In a first embodiment, the result register is probed by making contact with a bond pad on the die. Although contact testing is relatively slow, the probing of the result output may be performed with minimal contact with the die. For example, if a single bit value indicates whether the die passed or failed the testing, then a probe contact at a single bond pad of the die is capable of reading the bit value.

In a second embodiment, the result register is used along with other circuitry to provide a visual indication of whether the test passed or failed. For example, the result register may be coupled to a light-emitting diode (LED) or an infrared transmitter, which indicates the test result. Alternatively, the result register may be coupled to circuitry that allows high current to blow a fuse that is visibly detectable without needing to probe the die. An external imaging device such as a CCD or CMOS sensor can be used to automate the visual detection of pass and fail results of the die testing.

Additionally, the test results can all be linked together and shifted out to a single point on the wafer. The linking may be done in a manner that is similar to linking of the power lines, as will be discussed with reference to FIG. 6. In this scheme, a global clock signal may be used for the entire wafer. This technique of serially connecting adjacent die on a single wafer is one of the techniques used in wafer scale integration. The two die are connected by running metal lines through the scribe region. Precautions have to be taken to avoid shorts when the die is scribed but this is a known procedure.

Figure 4:
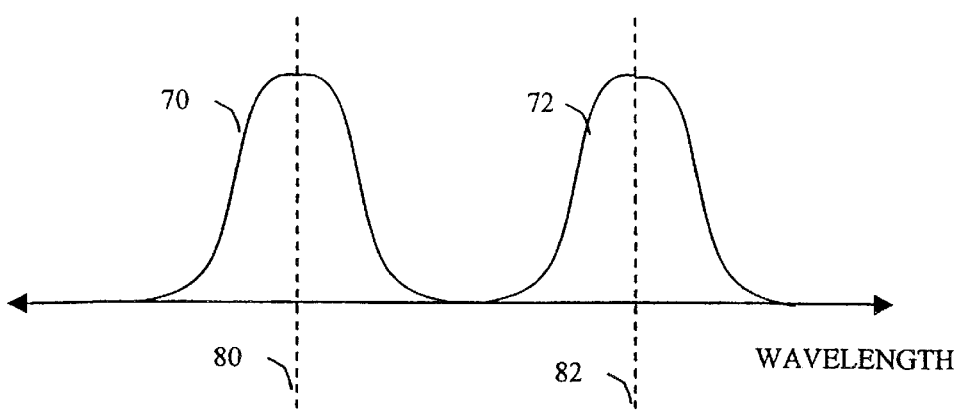
FIG. 4 shows exemplary spectral responses 70 and 72 of a first and second photosensor cell, respectively.

FIG. 4 shows exemplary spectral responses 70 and 72 of a first and second photosensor cell, respectively. The spectral responses correspond to the transmissivity of the color filter material used in the photosensor cells. The first photosensor cell has peak transmissivity around first wavelength 80 and the second photosensor cell has peak transmissivity around second wavelength 82. Because the first response 70 and second response 72 do not overlap, a spectral input centered around first wavelength 80 will cause the first photosensor, but not the second photosensor, to respond.

By using a different color filter for each photosensor, multiple photosensors can be placed on an IC die wherein each of the photosensors respond to mutually exclusive wavelength ranges, which may include both visible and non-visible light ranges. Examples of color filter material are molecular-dye material, such as polyimide, or pigmented polymer material, such as that described in co-pending U.S. patent application Ser. No. 09/172,734, entitled "Image Sensor Mounted by Mass Reflow," filed Oct. 13, 1998, and assigned to Intel Corporation. Table 1 shows an example of the composition of pigmented polymer color filter materials available through Fuji Film of Tokyo, Japan. Applicant has found the pigmented polymer color filter materials to be extremely stable over various temperatures.

TABLE 1

Composition of, pigment-dispersed Photoimagable RGB

| Monomer | Poly function Acrylates | $R-(C(=O)-CH=CH_2)_n$ |
|---|---|---|
| Binder | Acrylic acid/Acrylate copolymer | $(CH_2-CH)-(CH_2-C(CH_3))$ with COOH and COOR |

TABLE 1-continued

Composition of, pigment-dispersed Photoimagable RGB

| Initiator | Ditrihalomethyl-s-triazines | (pyrimidine ring with R, $CX_3$, $CX_3$ substituents) |
|---|---|---|
| Pigment (main) | Red: Diantraquinone Green: Halo-Cu-phthalocyanines Blue: Cu-Phehalocyanine Black: Carbon | |
| Solvent | Cellusolves | |

Figure 5:
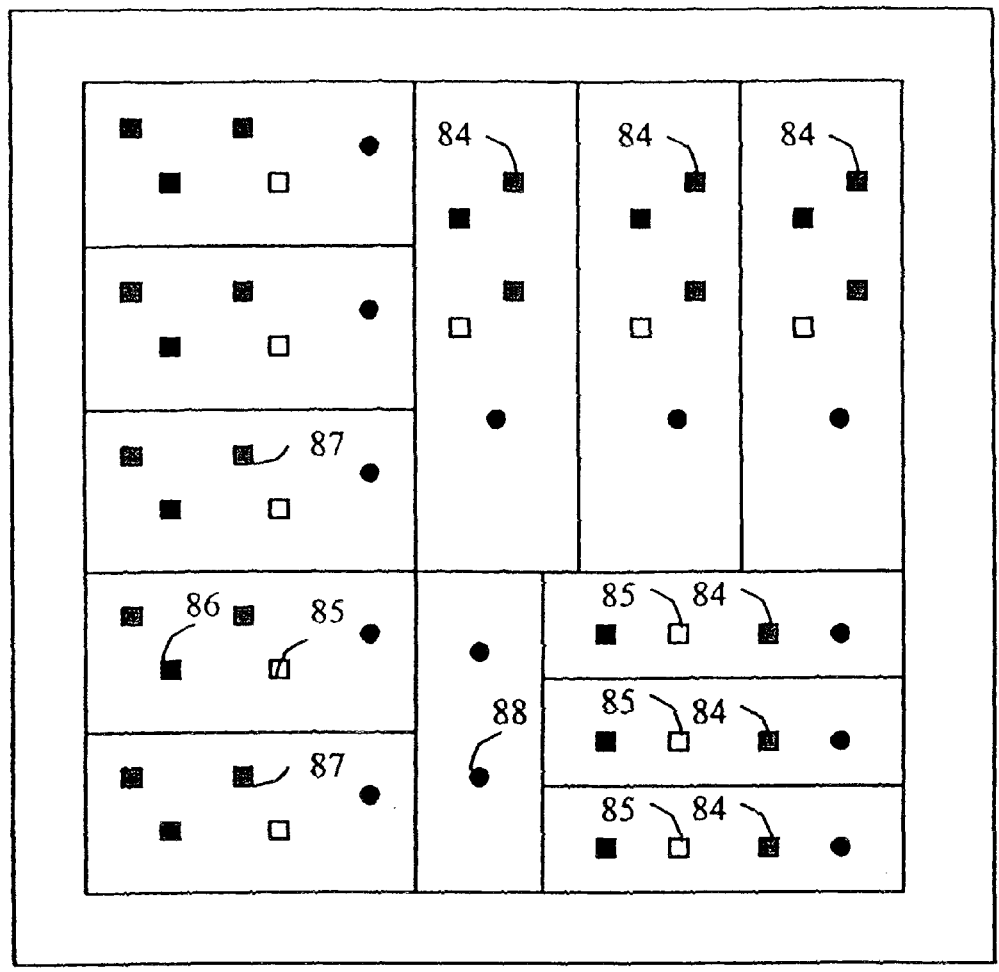
FIG. 5 shows a view of an IC die that employs multiple spectrally independent photosensors.

FIG. 5 shows a view of an IC die that employs multiple spectrally independent photosensors. The photosensors may be dispersed throughout the IC to provide multiple test inputs. For one embodiment, there are several sets of spectrally independent photosensors, each set having a particular color filter. As one example, a first set 84 of photosensors may provide a first clock signal; a second set 85 may provide a second clock signal; a third set 86 may provide a global reset signal; a fourth set 87 may provide a first data input, and so forth. Result indicators 88, such as light-emitting diodes (LEDs) or infrared transmitters can be used to provide result output indications.

For one embodiment, a microlens is placed over each photosensor cell. The microlens concentrates light to a smaller area. This allows the photosensor cell to be made smaller. Alternatively, using a microlens but not shrinking the photosensor cell size allows faster light detection, which leads to faster testing.

Figure 6:
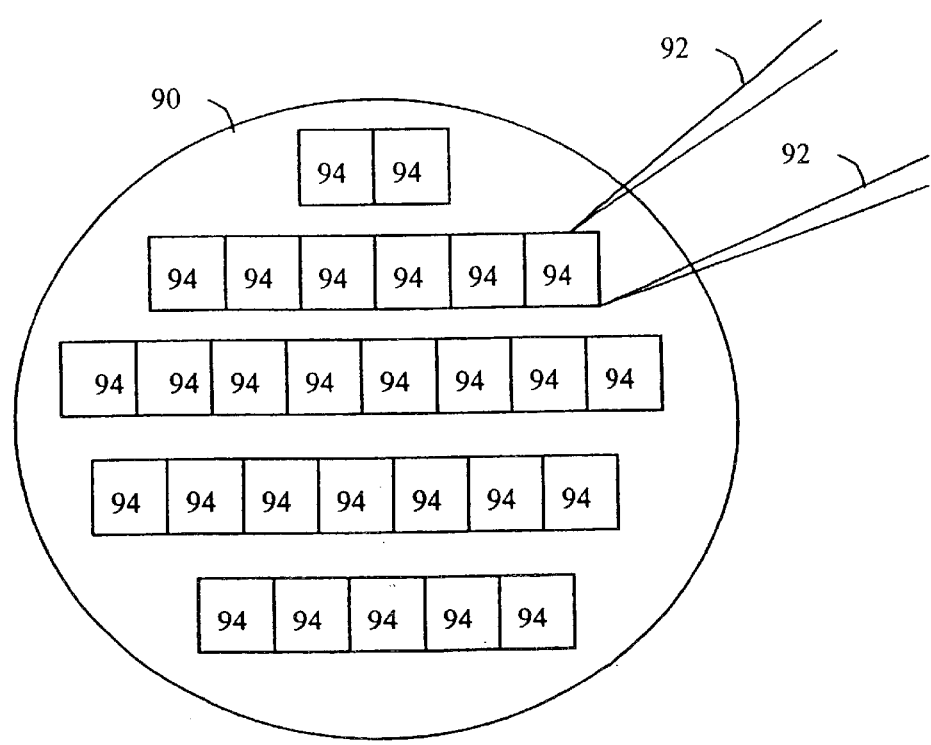
FIG. 6 shows exemplary wafer having multiple IC die being provided with electrical power and ground.

FIG. 6 shows exemplary wafer 90 having multiple IC die 94 being provided with electrical power and ground. For one embodiment, the power inputs are provided by contacts 92 across scribe lines so that power is provided to multiple die using a single contact to the wafer.

Using the techniques described in this application, an entire wafer can be illuminated with multiple light wavelengths at the same time. The light wavelengths correspond to the transmissivity peaks of the color filters associated with various photosensor inputs. The more spectrally independent photosensors made available on a die, the more parallel data input channels may be added. By illuminating the entire wafer at the same time, multiple individual die can be tested in parallel.

For one embodiment, multiple wavelength spectral input is provided in pulses to a wafer under test via a fiber optic. An electronic shutter may be employed to gate the spectral input. However, testing is not limited to wafer level testing. The same techniques may be applied to IC dies, devices, and circuit boards. For example, a die placed in a windowed package may allow spectral input of a particular wavelength. For one embodiment, spectral input to the die may be allowed only when the die is in a particular mode.

Additionally, the present invention has application in the area of security as well as testing. A color filter may be implemented such that only people who are able to provide the proper spectral inputs with the proper timings are able to gain access to the IC die, device, or circuit board. For example, in one embodiment, the gating signals and/or data signals from the spectral inputs are provided to a microcontroller that compares the input signals with a predefined key.

If the input signals match the predefined key, then access is granted to the IC die, device, or circuit board. Access includes, but is not limited to: reading from a register/buffer/memory/storage device, writing to a register/buffer/memory/storage device, reprograming the IC die, device, or circuit board, entering a superuser mode, enabling additional functionality, and so forth.

Figure 7:
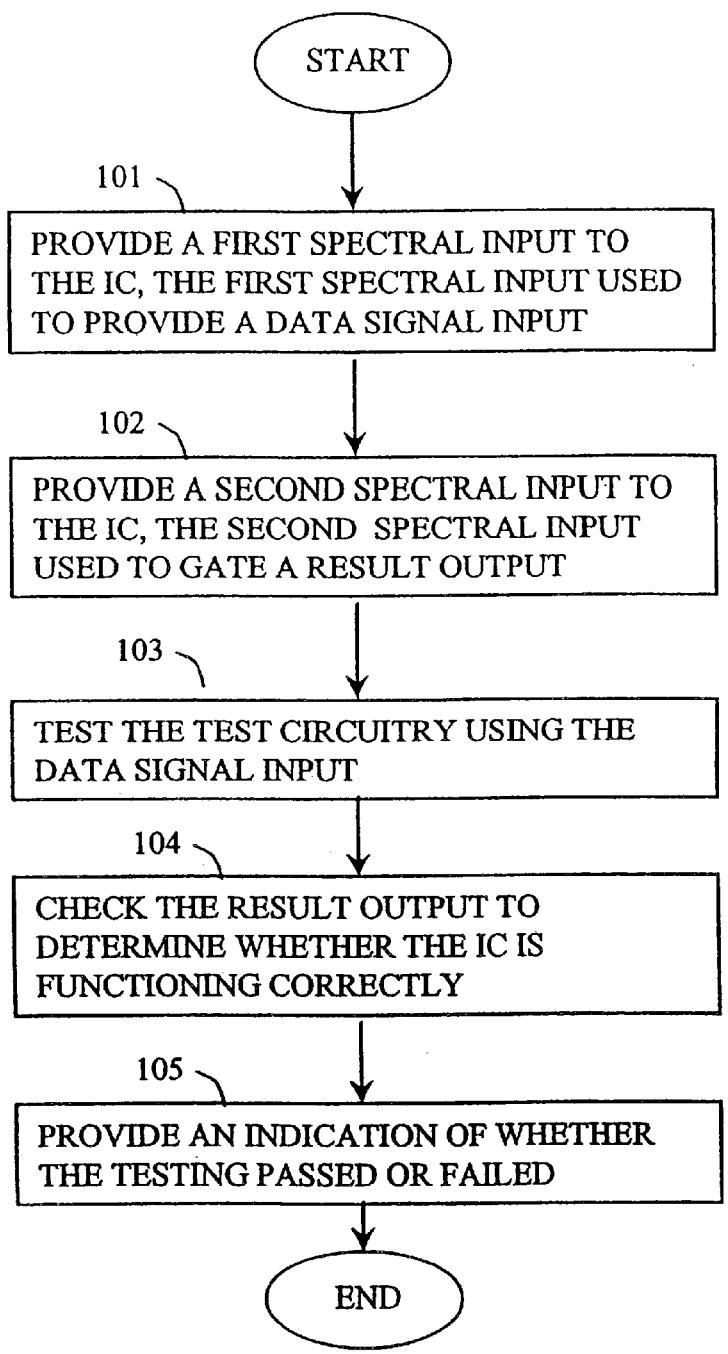
FIG. 7 shows a flowchart of one embodiment of a method of testing an IC using spectral inputs.

FIG. 7 shows a flowchart of one embodiment of a method of testing an IC. The flowchart starts at block 101, at which a first spectral input is provided to the IC. A photosensor converts the spectral input to a data signal input. At block 102, a second spectral input is provided. The second spectral input is converted by a second photosensor to a gating signal used to gate a result output. The first and second spectral inputs may be applied in parallel (at the same time) or at different times. At block 103, the test circuitry is tested using the data signal and gating signals as inputs. A result output of the testing is generated. The result output is checked at block 104 to determine whether the test circuitry is functioning properly. At optional block 105, an indication of whether the testing passed or failed is provided. This may be done by providing a light transmission in the visible or non-visible light range, e.g., with an LED or infrared transmitter. Alternatively, a fuse could be blown to show a visual indication responsive to the result output.

Figure 8:
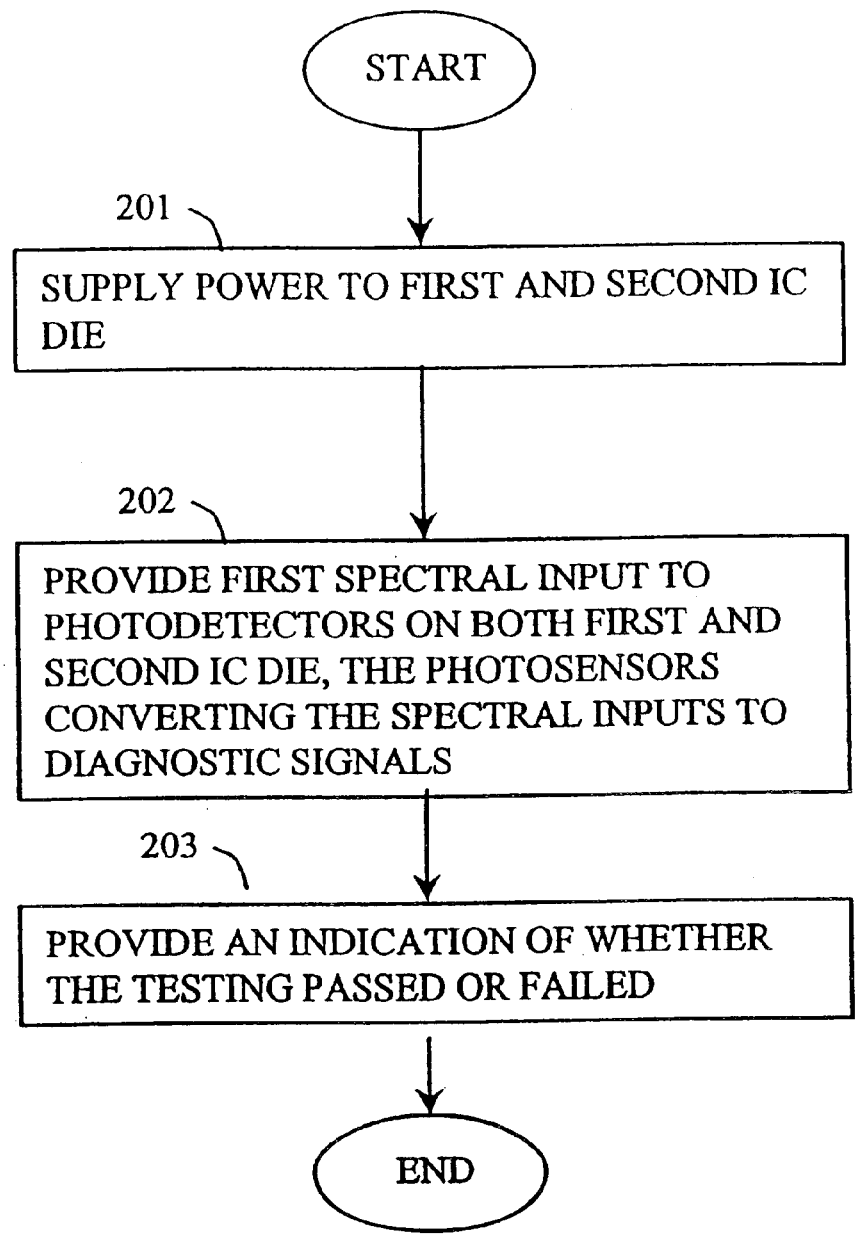
FIG. 8 shows a flowchart of one embodiment of testing two die in parallel.

FIG. 8 shows a flowchart of one embodiment of testing two die in parallel. This flowchart may be extended to testing multiple die in parallel. The flowchart starts at block 201, at which power is supplied to the first and second IC die. For one embodiment, the die are on the same wafer. In an alternative embodiment, the die are not on the same wafer but are still being tested with the same spectral input.

At block 202, a first spectral input is provided to photosensors on each of the die. In response, respective diagnostic signals are generated for providing input to test circuitry on the respective IC die. A result output is generated by the test circuitry. At optional block 203, an indication of whether the testing passed or failed is provided.

In one embodiment, clock circuitry is provided internally on the first and second IC dies, and the data inputs on each of the IC dies is provided via photosensors, similar to the embodiment discussed with respect to FIG. 7.

Figure 9:
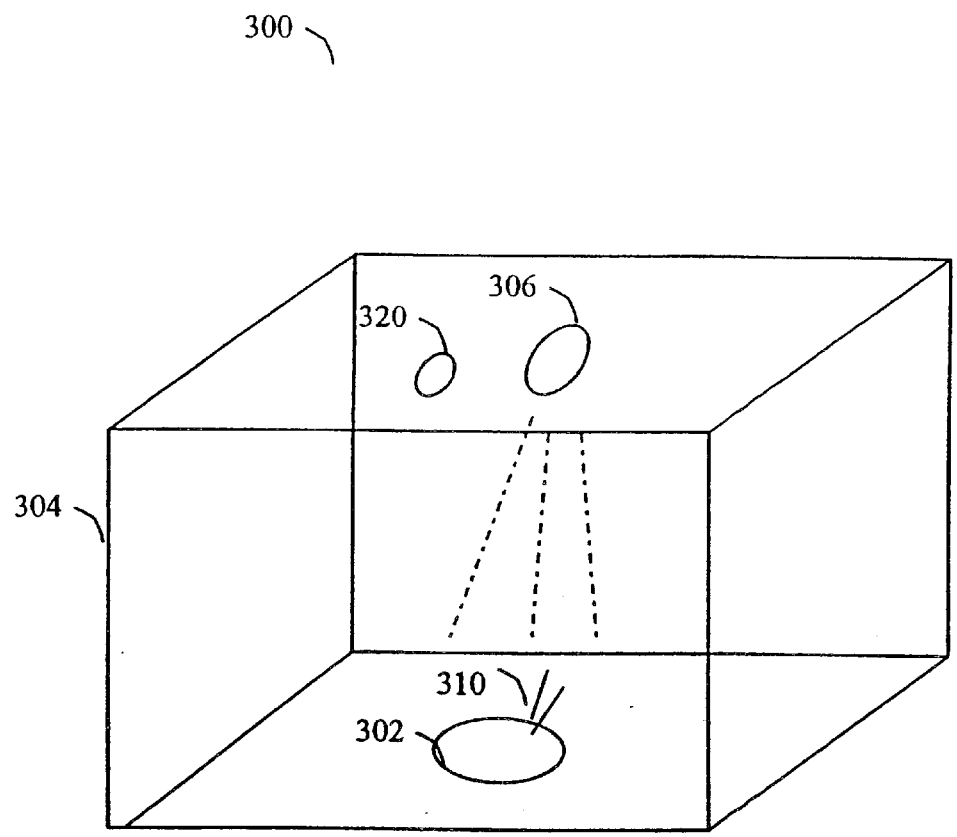
FIG. 9 shows one embodiment of a system for providing input to a device under test 302.

FIG. 9 shows one embodiment of a system for providing input to a device under test 302. The system comprises an enclosure 304 having a spectral source 306 for providing one or more wavelengths of light. The system also provides a power connector 310 for providing power and ground to the device. For one embodiment, an image sensor 320 detects an indication of the device under test passing a diagnostic test. The device under test may be a die, device, or circuit board.

Thus, an apparatus and method of contactless testing of an integrated circuit is disclosed. The specific arrangements and methods described herein are merely illustrative of the principles of this invention. Numerous modifications in form and detail may be made without departing from the scope of the described invention. Although this invention has been shown in relation to a particular embodiment, it should not be considered so limited. Rather, the described invention is limited only by the scope of the appended claims.

What is claimed is:

1. An integrated circuit, comprising:
   a photosensor;
   circuitry coupled with the photosensor to receive a diagnostic input from the photosensor, the diagnostic input indicating a bit pattern to test the circuitry; and
   a buffer to store a result output from the circuitry indicating whether the circuitry passed or failed a diagnostic test.

2. The integrated circuit of claim 1, further comprises a test indicator to provide an indication of whether the circuitry passed or failed a diagnostic test.

3. The integrated circuit of claim 1, further comprises a transmitter to provide an indication of whether the circuitry passed or failed a diagnostic test.

4. An apparatus, comprising:
   a first photosensor sensitive to a first wavelength of light provided to an integrated circuit by a first spectral input;
   a first circuit coupled with the first photosensor to convert the first spectral input to a first data input to the integrated circuit;
   a second photosensor sensitive to a second wavelength of light provided to the integrated circuit by a second spectral input;
   a second circuit coupled with the second photosensor to convert the second spectral input to a second data input to the integrated circuit;
   test circuitry coupled with the first and second circuits to receive the first and second data inputs, the first and second data inputs indicating a bit pattern to test the integrated circuit; and
   a buffer to store a result output from the test circuitry indicating whether the integrated circuit passed or failed a diagnostic test.

5. The apparatus of claim 4, further comprises a test indicator to provide an indication of whether the circuitry passed or failed a diagnostic test.

6. The apparatus of claim 4 further comprises a transmitter to provide an indication of whether the circuitry passed or failed a diagnostic test.

7. A method, comprising:
   supplying power to a first integrated circuit die and a second integrated circuit die; and
   supplying a first spectral input to a first photosensor on the first integrated circuit die and, concurrently with the first spectral input, supplying a second, spectrally independent input to a second photosensor on a second integrated circuit die, the first photosensor responding by providing a first diagnostic signal used to test circuitry on the first integrated circuit die, the second photosensor responding by providing a second diagnostic signal used to test circuitry on the second integrated circuit die.

8. The method of claim 7, wherein the first spectral input provided is within a visible light range.

9. The method of claim 7, wherein the first spectral input provided is outside a visible light range.

10. The method of claim 7, wherein the first spectral input is provided via a fiber optic.

11. A method, comprising:
   supplying a first spectral input to a first photosensor on an integrated circuit, the first photosensor responding by providing a first diagnostic signal to test circuitry on the integrated circuit; and
   supplying a second spectral input to a second photosensor on the integrated circuit wherein the first spectral input and the second spectral input are at different wavelengths, the second photosensor responding by providing a second diagnostic signal to the test circuitry on the integrated circuit.

12. The method of claim 11, wherein the first spectral input and the second spectral input are at different wavelengths of a visible light range.

13. The method of claim 11, wherein the first spectral input and the second spectral input are provided via fiber optics.

14. A machine-readable medium having stored thereon instructions to test circuitry on an integrated circuit, the instructions, when executed by a machine, cause the machine to:

supply power to the first integrated circuit die and the second integrated circuit die; and supply a first spectral input to a first photosensor on the first integrated circuit die and, concurrently with the first spectral input, supplying a second, spectrally independent input to a second photosensor on a second integrated circuit die, the first photosensor responding by providing a first diagnostic signal used to test circuitry on the first integrated circuit die, the second photosensor responding by providing a second diagnostic signal used to test circuitry on the second integrated circuit die.

15. The machine-readable medium of claim 14, wherein the first spectral input provided is within a visible light range.

16. The machine-readable medium of claim 14, wherein the first spectral input provided is outside a visible light range.

17. The machine-readable medium of claim 14, wherein the first spectral input is provided via a fiber optic.

18. A machine-readable medium having stored thereon instructions to test circuitry on an integrated circuit, the instructions, when executed by a machine, cause the machine to:

supply a first spectral input to a first photosensor on the integrated circuit, the first photosensor responding by providing a first diagnostic signal to the-test circuitry on the integrated circuit; and supply a second spectral input to a second photosensor on the integrated circuit wherein the first spectral input and the second spectral input are at different wavelengths, the second photosensor responding by providing a second diagnostic signal to the test circuitry on the integrated circuit.

19. The machine-readable medium of claim 18, wherein the first spectral input and the second spectral input are at different wavelengths of a visible light range.

20. The machine-readable medium of claim 18, wherein the first spectral input and the second spectral input are provided via fiber optics.

21. A system, comprising:

an integrated circuit having
a photosensor,
circuitry coupled with the photosensor to receive a diagnostic input from the photosensor, the diagnostic input indicating a bit pattern to test the circuitry, and
a buffer to store a result output from the circuitry indicating whether the circuitry passed or failed a diagnostic test.

22. The system of claim 21, further comprises a test indicator to provide an indication of whether the circuitry passed or failed a diagnostic test.

23. The system of claim 21, further comprises a transmitter to provide an indication of whether the circuitry passed or failed a diagnostic test.

24. A system, comprising:

a first photosensor sensitive to a first wavelength of light provided to an integrated circuit by a first spectral input;

a first circuit coupled with the first photosensor to convert the first spectral input to a first data input to the integrated circuit;

a second photosensor sensitive to a second wavelength of light provided to the integrated circuit by a second spectral input;

a second circuit coupled with the second photosensor to convert the second spectral input to a second data input to the integrated circuit;

test circuitry coupled with the first and second circuits to receive the first and second data inputs, the first and second data inputs indicating a bit pattern to test the integrated circuit; and a buffer to store a result output from the test circuitry indicating whether the integrated circuit passed or failed a diagnostic test.

25. The system of claim 24, further comprises a test indicator to provide an indication of whether the circuitry passed or failed a diagnostic test.

26. The system of claim 24, further comprises a transmitter to provide an indication of whether the circuitry passed or failed a diagnostic test.

* * * * *

UNITED STATES PATENT AND TRADEMARK OFFICE
CERTIFICATE OF CORRECTION

PATENT NO. : 6,686,760 B2 Page 1 of 1
DATED : February 3, 2004
INVENTOR(S) : Hirt It is certified that error appears in the above-identified patent and that said Letters Patent is hereby corrected as shown below:

Column 1,
Line 66, delete "emboidment" and insert -- embodiment --.

Signed and Sealed this

Twenty-second Day of June, 2004

JON W. DUDAS
*Acting Director of the United States Patent and Trademark Office*